United States Patent [19]
Jaffe et al.

[11] 4,017,495
[45] Apr. 12, 1977

[54] ENCAPSULATION OF INTEGRATED CIRCUITS

[75] Inventors: Donald Jaffe, Emmaus; Nicholas Alec Soos, Macungie, both of Pa.

[73] Assignee: Bell Telephone Laboratories, Incorporated, Murray Hill, N.J.

[22] Filed: Oct. 23, 1975

[21] Appl. No.: 625,315

[52] U.S. Cl. .............................. 264/272; 29/588; 264/347

[51] Int. Cl.² ......................................... B29C 6/00

[58] Field of Search ................. 264/272, 236, 347; 29/588, 627; 260/33.6 SB

[56] References Cited

UNITED STATES PATENTS

| | | | |
|---|---|---|---|
| 3,606,673 | 9/1971 | Overman | 260/33.6 SB |
| 3,631,589 | 1/1971 | Gorceau | 260/33.6 SB |
| 3,661,816 | 5/1972 | Pepe | 260/33.6 SB |
| 3,661,817 | 5/1972 | Hamilton et al. | 260/33.6 SB |
| 3,819,772 | 6/1974 | Kolobow | 260/33.6 SB |
| 3,845,161 | 10/1974 | Beers | 260/33.6 SB |

*Primary Examiner*—James B. Lowe
*Attorney, Agent, or Firm*—Lester H. Birnbaum

[57] ABSTRACT

Disclosed is a method of encapsulating integrated circuit chips formed on an insulating substrate which permits complete filling of areas under the chip. The encapsulant employed is a dispersion of a material, such as a silicone elastomer, which cures by reaction with water vapor. Subsequent to application of the encapsulant over and under the chip, the solvent of the dispersion is evaporated during a pre-cure treatment by means of a dry ambient of less than 5% relative humidity which suppresses crosslinking. After essentially all the solvent is thus removed, the encapsulant is cured by exposure to a second ambient of higher relative humidity which enhances crosslinking.

11 Claims, 3 Drawing Figures

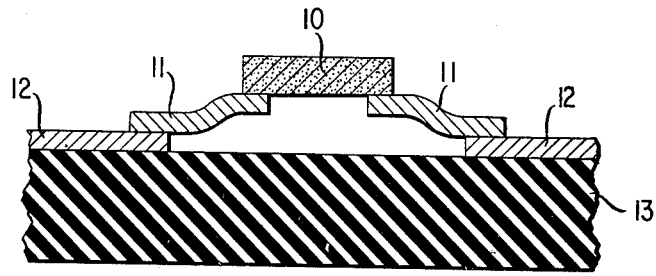
FIG. 1A
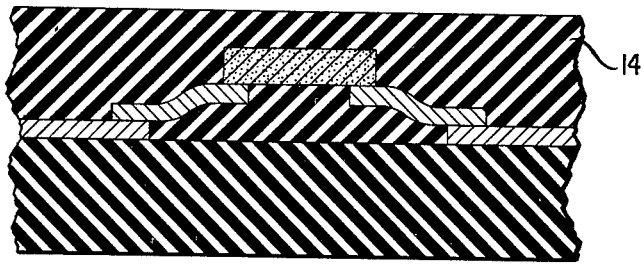
FIG. 1B
FIG. 2
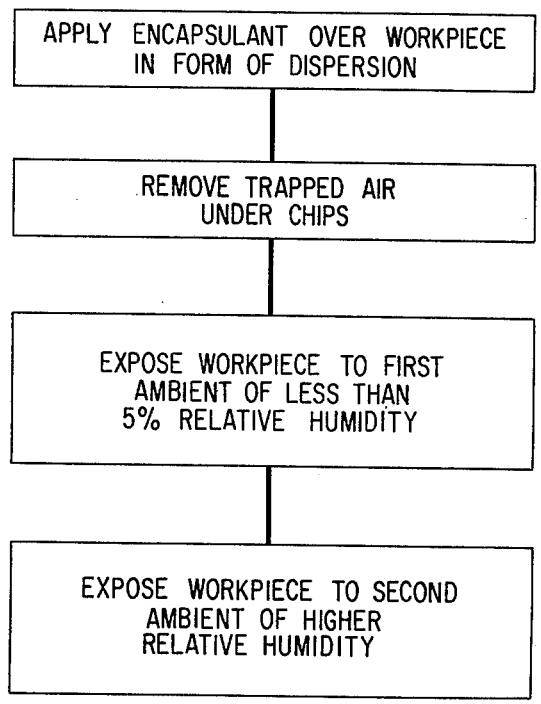

ENCAPSULATION OF INTEGRATED CIRCUITS

BACKGROUND OF THE INVENTION

This invention relates to encapsulation of integrated circuit chips which are bonded to a metallized insulation substrate primarily for the purpose of mounting or inclusion as part of a hybrid integrated circuit.

In semiconductor technology, integrated circuit chips are bonded to metallized substrates for mounting purposes, as in dual in-line packages, or for inclusion as part of a hybrid integrated circuit which includes many chips and thin film elements. In order to protect such chips from moisture, particulate matter, and damage during assembly, it is usually necessary to apply some form of encapsulant. A suitable form of encapsulating material for such uses has been found to be RTV (Room Temperature Vulcanizing) silicone compounds which are characterized by their curing (crosslinking) as the result of reaction with moisture in the air to form a silicone elastomer or rubber. In order to permit the RTV silicone compound which is in the form of a paste, to be applied by standard flow-coating techniques, it is usually diluted with a suitable solvent to form a dispersion of the desired viscosity. After application, the encapsulant is usually cured at room temperature in an ambient which permits crosslinking.

Use of such encapsulants has generally been satisfactory. However, when beam-leaded chips are bonded to substrates, the chip is slightly raised above the substrate and complete filling of thes gaps under the chips by the encapsulant becomes important for complete protection. Complete under-chip filling has been found to be a problem with encapsulants using standard curing procedures, especially in view of the increasing size of chips needed for sophisticated applications such as memories. Typically, for square chips no greater than about 0.060 inches on a side, complete filling is consistently obtained with commercially available RTV dispersions using standard solvent removal and curing techniques. However, for square chips measuring about 0.080 inches on a side or greater, complete under-chip filling typically cannot be consistently obtained with commercially available RTV dispersions using standard techniques.

It is therefore a primary object of the invention to provide a method of encapsulating beam-leaded integrated circuit chips which results in complete filling under the chips even for large area chips.

SUMMARY OF THE INVENTION

This and other objects are achieved in accordance with the invention. The encapsulant, in the form of a dispersion of solids in a solvent is applied over the chip. Essentially all of the solvent is then removed by exposure to dry ambient with a relative humidity of less than 5% which retards crosslinking. Standard curing operations are then performed in an atmosphere of higher relative humidity which allows crosslinking of the encapsulating material. It has been found that this control of the rate of evaporation of the solvent relative to the rate of crosslinking allows the encapsulant to flow underneath the chips and completely fill the gap between chip and substrate.

BRIEF DESCRIPTION OF THE DRAWING

These and other features of the invention are delineated in detail in the following description. In the drawing:

FIGS. 1A–1B are cross-sectional views of a portion of a circuit during different stages of fabrication in accordance with one embodiment of the invention; and FIG. 2 is a flow diagram showing the basic steps of the method in accordance with the same embodiment.

It will be understood that for purposes of illustration of the features of the invention, these figures are not necessarily drawn to scale.

DETAILED DESCRIPTION OF THE INVENTION

For purposes of describing the invention, the encapsulation of a single beam-leaded semiconductor chip is illustrated in FIGS. 1A–1B and the basic steps depicted in FIG. 2. It will be appreciated that this chip could be part of a hybrid integrated circuit including many chips along with other circuit elements, or could be part of an integrated circuit package. It will be clear in any event that many such chips may be simultaneously encapsulated by the inventive method.

In FIG. 1A, a portion of a typical workpiece is shown comprising a silicon integrated circuit chip, 10, which is contacted by beam leads, two of which are shown as 11. The beam leads have been thermocompression bonded by standard techniques to metallization 12 formed on a major surface of insulating substrate 13, which typically comprises a ceramic material. As a result of the thermocompression bonding, the chip is left slightly raised from the surface of the substrate. The gap between chip and substrate is usually of the order of 0.001 – 0.003 inch.

As illustrated in FIG. 2, an encapsulant, in the form of a dispersion, (14 of FIG. 1B) is then applied over the workpiece including the integrated circuit chip. The method employed for applying the encapsulant is a standard flowcoating procedure. This involves generally providing the encapsulant in a dispenser under controlled pressure and discharging the material so that it flows over essentially the entire workpiece. The thickness of encapsulant is typically in the range of 0.040 to 0.080 inch, as applied and 0.010 and 0.030 inch after solvent removal and curing. As mentioned previously, this encapsulant is in the form of a dispersion of the encapsulating material in a suitable solvent. In a particular example, the dispersion comprised a solvent of xylene and solids comprising the silicone polymer, silica filler, pigment and carbon black, crosslinker, catalyst, and othe associated ingredients required for stabilization and proper curing. The ratio was approximately 67% xylene and 33% solids by weight. Such an encapsulant is sold by Dow Corning Co. under the designation DC 96–084 RTV Dispersion. It should be clear that this encapsulant is only illustrative and many other standard materials may be used. For example, aother encapsulant successfully tested was that supplied by SWS Silicone Corporation under the designation 296 Type RTV. In general, the present invention could find use with any dispersion of an encapsulating material which cures by reaction with water vapor.

Since air bubbles are often trapped under the chip after flowcoating, the workpiece is then "de-aired" by placing it in a vacuum chamber for a few minutes under a pressure near 20 Torr. This is in accordance with standard practice.

At this stage, the workpiece looks essentially as depicted in FIG. 1B with the encapsulant shown as 14. The liquid dispersion has completely filled the area under the chip. However, the problem with the prior art practice was keeping the area under the chip filled during and after the curing of the encapsulant.

In accordance with a main feature of the invention, the workpiece next undergoes a pre-cure treatment. This involves placing the workpiece in a standard isolation chamber which contains a flowing ambient of low humidity and includes a suitable exhaust system. The purpose of this step is to evaporate essentially all of the solvent (i.e., at least 99%) while retarding crosslinking of the encapsulating material. It was found that in order to accomplish this, the ambient should be less than 5% relative humidity, and optimum benefit was achieve at a relative humidity of less than 1 per cent. In this particular example, the ambient introduced was dry nitrogen with a relative humidity of approximately 0.25 per cent. It appears however that any dry ambient, including air, may be used within the humidity constraints mentioned. The nitrogen ambient is preferred primarily because of its nonreactivity with the encapsulant and because it will not produce an explosive atmosphere when mixed with xylene vapors.

In accordance with a further feature of the invention, the flow rate of the ambient is preferably adjusted so that the time for evaporation of the solvent is at least 1 hour. It was found that when evaporation times were below this value, complete under-chip coverage was not always obtained. For optimum benefit, it is recommended that the evaporation time be at least three hours. The precise ambient flow rate necessary to achieve this evaporation rate will of course depend on the size of the workpiece and the configuration of the chamber. Such determinations are easily within the skill of the art. In a particular example, the chamber measured 2 ft × 2 ft × 4 in, and the circuit measured approximately 1.25 × 0.50 inches. It was found that a flow rate of approximately 5 liters/min. of dry nitrogen effected complete evaporation after approximately 5 hours when 120 of the above-mentioned circuits were processed.

Next, as illustrated in FIG. 2, the workpiece undergoes the standard curing procedure. This usually involves leaving the workpiece in air at room temperature for approximately two hours and heating in air at 120° C for approximately six hours. Curing can also be done entirely at room temperature. For optimum curing, the relative humidity of the air ambient both at room temperature and 120° C should be in the range 20-60% as measured at room temperature to promote crosslinking of the silicone.

The effectiveness of the present method was demonstrated using both simulated glass chips and actual beam-leaded silicon integrated circuits. In one set of experiments, for example, simulated glass chips of 0.160, 0.240 and 0.320 inches on a side were utilized. Encapsulant from several different "lots" of commercially supplied RTV dispersion was applied to the chips. Half the chips underwent the present method including the pre-cure treatment while half were cured by the conventional practice. Complete under-chip filling was obtained on all chips processed in accordance with the invention. Underchip filling using conventional practice varied widely and depended upon the "lot" of encapsulant. In some cases filling was not complete under the 0.160 inch chips. It should be pointed out that it has been found that the size of simulated glass chips which can be completely filled underneath with a given dispersion and process is approximately twice that which can be realized on actual beam-leaded chips on electronic circuits. Further, in studies utilizing a 0.125 × 0.150 inch beam-leaded integrated circuit chip, complete underchip filling was always obtained using the present method while essentially none of the cips encapsulated with the prior art procedure showed adequate filling. Based on these and other experiments, it is believed that the inventive method is particularly desirable for chips having an area of 0.0036 in.$^2$ or greater.

It is not entirely clear at this point why the pre-cure treatment is so effective in obtaining complete underchip filling. It is theorized, however, that as the solvent is evaporated, an area of low pressure is created under the chip, and as long as the remaining material is sufficiently fluid, it will flow under the chip to replace the solvent removed. Thus, if the solvent is removed according to the prior art practice during curing, the encapsulant will crosslink and greatly decrease its fluidity (increase its viscosity) before it has a chance to replace the evaporated solvent under the chip. During the pre-cure treatment in accordance with the invention, however, crosslinking of the encapsulant is retarded and the material is permitted to flow in order to fill the gap. This theory is offered as a possible explanation for the effectiveness of the inventive method and is not intended to limit the scope of the invention thereby.

In addition to the improvement of the underchip filling, it was also found that the present invention eliminates the cracking of the encapsulant which can result in certain circuits such as those including closely spaced applique chip capacitors and those made on very small substrates.

Various modifications of the present invention will become apparent to those skilled in the art. All such variations which basically rely on the teachings through which the invention has advanced the art are properly considered within the spirit and scope of the invention.

What is claimed is:

1. A method of encapsulating a circuit element formed on an insulating substrate wherein a gap exists between the element and the substrate and whereby the area under the element is filled with encapsulant comprising the steps of:
    applying over and under said element an encapsulant comprising a dispersion of a material which cures by reaction with moisture;
    evaporating the solvent of said dispersion by exposure to a first dry ambient with a relative humidity of less than 5%, which suppresses crosslinking and curing the material by exposure to a second ambient with a relative humidity of at least 20%.

2. The method according to claim 1 wherein the circuit element is a beam-leaded integrated circuit chip which is raised above the surface of said substrate so as to form a gap between chip and substrate.

3. The method according to claim 1 wherein the solvent of said dispersion comprises xylene.

4. The method according to claim 1 wherein the encapsulating material comprises a silicone elastomer.

5. The method according to claim 1 wherein the first ambient comprises nitrogen.

6. The method according to claim 1 wherein the second ambient comprises air.

7. The method according to claim 1 wherein the solvent is evaporated for a time of at least one hour.

8. The method according to claim 1 wherein the relative humidity of the first ambient is less than 1%.

9. The method according to claim 1 wherein the relative humidity of the second ambient is within the range 20–60%.

10. A method of encapsulating a beam-leaded integrated circuit chip formed on an insulating substrate wherein a gap exists between the chip and the substrate and whereby the area under the chip is filled with encapsulant comprising the steps of:

applying over and under said chip and substrate an encapsulant comprising a dispersion of a room temperature vulcanizing silicone elastomer which cures by reaction with moisture;

evaporating the solvent of said dispersion by exposure to a first dry ambient with a relative humidity of less than 5% for a minimum of 1 hour, which suppresses crosslinking; and curing the material by exposure to a second ambient with a relative humidity in the range 20–60%.

11. A method of encapsulating a beam-leaded integrated circuit chip with sides at least 0.080 inches long formed on an insulating substrate wherein a gap exists between chip and substrate in the range of 0.01 – 0.003 inches and whereby the area under the chip is filled with encapsulant comprising the steps of:

applying over and under said chip and substrate an encapsulant comprising a dispersion of a solvent comprising zylene and a room temperature vulcanizing silicone elastomer which cures by reaction with moisture;

evaporating essentially all of the solvent by exposure to a first ambient comprising nitrogen with a relative humidity of less than 1% for a minimum of three hours which suppresses crosslinking; and curing the material by exposure to air with a relative humidity in the range 20–60%.

* * * * *

UNITED STATES PATENT AND TRADEMARK OFFICE
CERTIFICATE OF CORRECTION

PATENT NO. : 4,017,495
DATED : April 12, 1977
INVENTOR(S) : Donald Jaffe and Nicholas A. Soos It is certified that error appears in the above–identified patent and that said Letters Patent are hereby corrected as shown below:

Column 2, line 60, change "aother" to --another--.

Column 3, line 51, after "temperature." insert

--Curing is done in an ambient of at least 20% relative humidity.--.

Column 6, line 8, change "0.01" to --.001--.

Signed and Sealed this

Twenty-fourth Day of May 1983

[SEAL]

Attest:

DONALD J. QUIGG

Attesting Officer    Acting Commissioner of Patents and Trademarks